Figure 1:
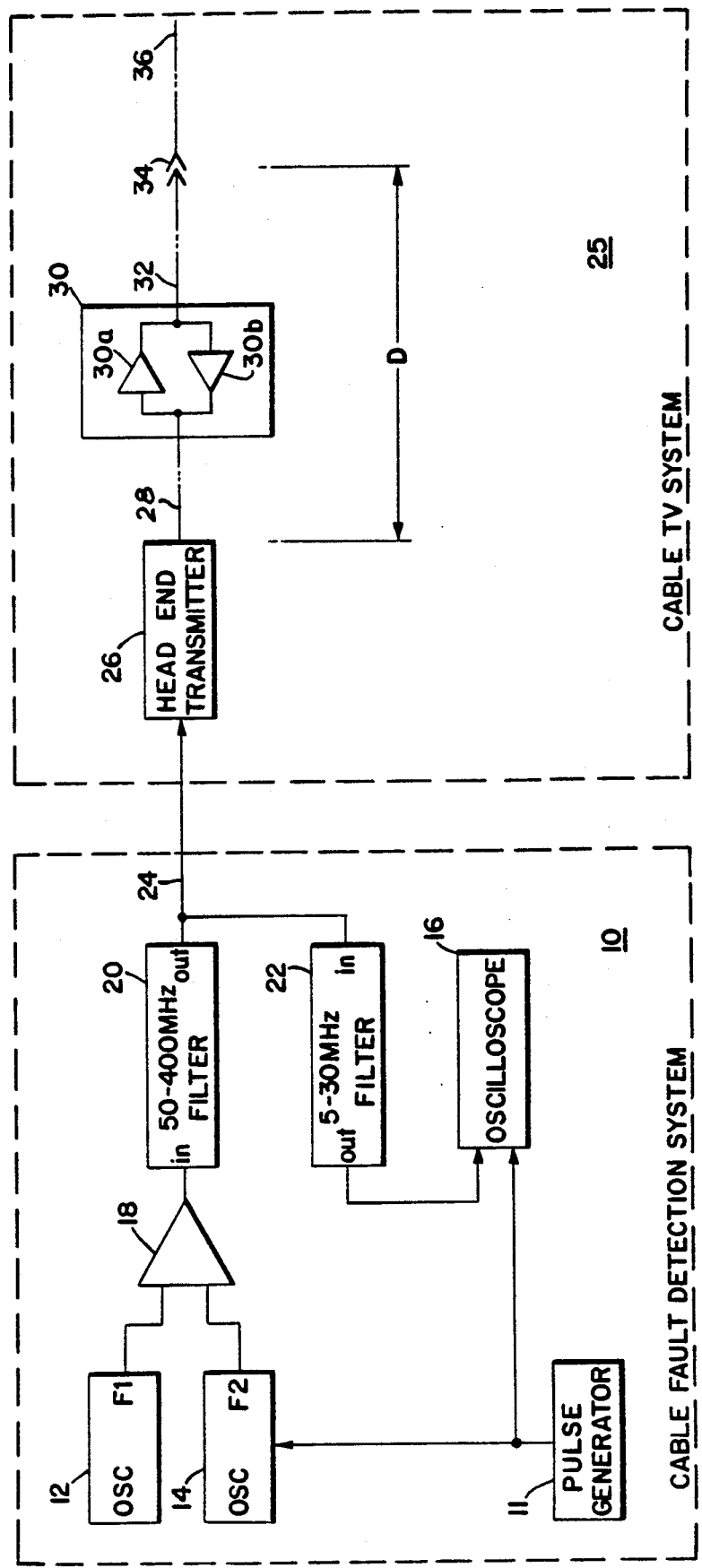

United States Patent [19]

Reichert, Jr.

[11] 4,404,514
[45] Sep. 13, 1983

[54] FAULT DETECTION SYSTEM AS FOR LOCATING FAULTY CONNECTIONS IN A CABLE TELEVISION SYSTEM

[75] Inventor: Harry J. Reichert, Jr., Warminster, Pa.

[73] Assignee: General Instrument Corporation, New York, N.Y.

[21] Appl. No.: 295,565

[22] Filed: Aug. 24, 1981

[51] Int. Cl.$^3$ .................... G01R 31/08; H04B 3/46
[52] U.S. Cl. .................... 324/52; 179/175.3 F
[58] Field of Search ............ 358/86; 179/175.3 F, 179/170 F, 175.3 R, 175.31 R; 324/52, 58.5 R, 51

[56] References Cited

U.S. PATENT DOCUMENTS

| | | | |
|---|---|---|---|
| 3,629,523 | 9/1969 | Chalhoub | 179/170 F X |
| 4,025,737 | 5/1977 | Brewer | 179/175.31 R |
| 4,099,117 | 7/1978 | Erath | 324/52 X |

FOREIGN PATENT DOCUMENTS 1091841  10/1953  France ........................ 179/175.31

*Primary Examiner*—Stanley T. Krawczewicz
*Assistant Examiner*—Jose M. Solis
*Attorney, Agent, or Firm*—Allan J. Jacobson

[57] ABSTRACT

A fault detection system is provided for detecting and locating faulty connections in a cable TV system. First and second signals are generated at the head end transmitter. The first signal is a continuous wave signal. The second signal is a pulse modulated sine wave signal. A fault is indicated by the reception of a beat frequency signal between the first and second signals generated at the location of the faulty connection and returned to the head end. The location of the fault is determined by measuring the time interval between the transmission of the first and second signal and the return of the beat frequency signal, and relating such time interval measurement to the corresponding distance between the head end and the faulty connection.

7 Claims, 1 Drawing Figure

FAULT DETECTION SYSTEM AS FOR LOCATING FAULTY CONNECTIONS IN A CABLE TELEVISION SYSTEM

DISCLOSURE OF THE INVENTION

This invention pertains to a system for detecting and locating faulty connections in a communication system.

A broadband communication system, such as a cable TV network has connections variously placed along the signal distribution path between the head end transmitter and the downstream subscribers. When a connection fails completely, no signal is distributed to a portion of the cable subscribers downstream of the failed connection. Similarly, when a connection partially fails, a degraded signal (such as a television picture with "snow") is distributed to a portion of the cable subscribers.

In either case, the system operator can diagnose the approximate location of the faulty connection from the pattern of subscriber complaints. Then, a service technician in the field can determine the exact location of the fault by physically tracing the signal along the actual cable distribution path.

The fault detection system of the present invention is based on the detectable characteristics of failing connectors while such connectors are in the early stages of failure.

Specifically, a good connector provides intimate conductor to conductor contact. As the connector begins to fail, deleterious substances are introduced between the mating surfaces of the conductors which changes the radio frequency (RF) characteristics of the connection. As an example, a particular type of connector includes a copper clad aluminum pin pressed against a cadmium plated receptacle. For various reasons, (e.g., aluminum cold flow, etc.) oxygen enters between the pin and the receptacle causing a build up of copper oxide between the mating surfaces of the conductors. The resulting conductor-oxide-conductor structure forms a connection having non-linear transfer characteristics with respect to RF signals. The faulty connection interacts with system signals in the same manner as other non-linear devices, e.g., a diode, in that the non-linear transfer characteristics of the faulty connection provide a mixing action of RF signals transmitted across the conductor-oxide-conductor structure. Thus, the faulty connection acts as a mixer, wherein the transmitted RF signals are heterodyned at the faulty connection forming numerous sum and difference beat frequencies between the various transmitted RF signals. The oxide layer also increases the connector resistance, thus generating heat which in turn accelerates further oxide build up between the contacts of the connector.

In accordance with the present invention, first and second RF signals are transmitted from the head end transmitter through the cable system. A receiver at the head end of the cable system is provided for receiving a signal having a frequency corresponding to a beat frequency between the first and second transmitted signals. The time interval between the transmission of the first and second transmitted signals and the reception of the beat frequency signal is measured. Since the velocity of signal propagation along the cable is known, the measured time interval provides an indication of the distance from the head end to the faulty connection.

The sole FIGURE shows a block diagram of a cable fault test system in accordance with the present invention. In the specific embodiment shown, the first transmitted signal is a continuous wave (CW) signal of a first frequency F1. The second transmitted signal is a pulse modulated sine wave signal of a second frequency F2. A receiver at the head end is tuned to select a particular beat frequency of the first and second signals equal to the difference between the frequency of the first and second signals. The measured time interval extends from the start of the pulse modulated sine wave to the reception of the beat frequency signal (F2−F1). Since the measured time interval represents the time required for the first and second signals to propagate from the head end to the faulty connection plus the time required for the beat frequency to propagate from the faulty connection back to the head end, the distance of the faulty connection from the head end is substantially equal to the measured time interval times the propagation velocity of a cable signal divided by two.

The cable fault detection system 10 comprises a pulse generator 11, two oscillators 12 and 14, a signal summation amplifier 18, two filters 20 and 22, and an oscilloscope 16. One oscillator 12 provides a CW ouput signal at frequency F1. The other oscillator 14 includes a control input terminal for selectively enabling a sine wave output signal at frequency F2. The respective output signals from oscillators 12 and 14 are added together in summation amplifier 18 and the output thereof is applied to the input terminal of filter 20. Filter 20 passes signals in the forward transmission spectrum of the cable system, typically 50 to 400 megahertz (MHZ). The output of filter 20 is applied to conductor 24. Pulse generator 11 provides periodic output pulses to the control input terminal of oscillator 14, which output pulses are also applied to the sweep trigger input terminal of oscilloscope 16. Filter 22 passes signals in the return transmission spectrum of the cable system, typically 5 to 30 MHZ. The input of filter 22 is connected to conductor 24. The output of filter 22 is applied to the vertical deflection input of oscilloscope 16.

One trunk of a cable television system 25 is represented in the FIGURE comprising a head end transmitter 26, a trunk cable 28, a line amplifier 30 driving cable 32, and a typical system connector 34. Beyond connector 34, the cable 36 extends the transmitted signals to other portions of the cable system.

In operation, the output of the cable fault detection system 10 on conductor 24 is applied to the head end transmitter 26 for transmission through the cable system. Since oscillator 12 provides a CW signal, a sine wave signal of frequency F1 is continuously distributed throughout the cable system. A system test begins with a pulse signal from pulse generator 11. The oscillator 14 is enabled for the duration of the pulse signal whereby a pulse modulated sine wave signal of frequency F2 is introduced into the cable system. The pulse signal from pulse generator 11 also triggers oscilloscope 16 initiating a sweep of the electron beam in the oscilloscope.

The pulse modulated sine wave signal propagates through forward amplifier 30a of line amplifier 30, and travels a total distance D from the head end transmitter 26 to the connector 34. If connector 34 is faulty, as described above, it will produce a beat frequency between the continuous signal of frequency F1 and the pulsed modulated signal of frequency F2. As a specific example, assume that F1 equals 83 MHZ and F2 equals 73 MHZ. Therefore, a 10 MHZ pulse modulated beat frequency signal is generated at connector 34.

As the pulse modulated 10 MHZ signal propagates from connector 34 towards the head end transmitter 26, it is amplified in amplifier 30b of line amplifier 30. The returning beat frequency pulse signal on conductor 14 passes through filter 22 which provides an output signal to oscilloscope 16. Since the horizontal scale of the oscilloscope 16 is calibrated in units of time, the time interval between the transmitted pulse modulated sine wave signal and the returning pulse modulated beat frequency signal is displayed on the oscilloscope screen as a horizontal displacement of the returning pulse from the transmitted pulse. As described above, the measured time interval is converted to the distance D measured from the head end transmitter 26 to the faulty connection 34.

The fault detection system of the present invention provides an indication of the location of the faulty connection without the necessity of physically tracing the cable signal in the field. Furthermore, the faulty connection can be detected before the connection failure becomes severe enough to affect the forward transmission of video signals. Equally important, faulty connections that would generate signals in the return transmission portion of the cable spectrum can be detected and replaced so that such connections do not generate undesired signals. This is particularly important in two way cable systems where the return transmission portion of the cable spectrum must be kept clear of unwanted signals that might otherwise interfere with communications from the subscriber stations to the head end.

The fault detection system of the present invention also permits periodic monitoring of the cable network at regular intervals. It can be used during normal cable operation while the system is distributing regular television signals. For multi-trunk systems, switching apparatus can be provided in conjunction with the present invention to test each trunk separately under computer control at the head end. The head end computer can also automatically convert the time interval measurement to distance and print out the exact location of connections suspected of being faulty. The present invention may also be embodied in a microprocessor controlled self-contained test instrument, programmed for direct read-out in time or distance. In such case, the first and second signals may be introduced into the cable network at various points in the system other than by the head end transmitter.

The present invented technique differs from the well known technique embodied in an instrument known as a "Time Domain Reflectometer". The latter instrument uses a radar-like principle to detect system mismatches and discontinuities. In that technique, one signal is transmitted and its echo is received. In the present invention, two signals are transmitted and a return signal having a frequency corresponding to a beat frequency between the two transmitted signals is received. However, it will be understood that while the specific embodiment illustrates one means for measuring the time interval between transmitted and received signals, other well known time interval measurement techniques, such as autocorrelation, may be used with the present invention.

Various alternate embodiments of the present invention are possible. For example, the frequencies of the transmitted signals may be of alternate values, both first and second transmitted signals may be pulse modulated, and, rather than use a CW signal, one of the transmitted signals can be a regular video signal which is normally transmitted through the cable system. Also, the sensitivity of the measurement may be enhanced by increasing the amplitude of the transmitted frequencies above that of the normal video signal carried on the cable. A beat frequency corresponding to the sum of the frequencies of the transmitted signals may also be used. However, since line amplifier 30 provides amplification 30b in the return portion of the cable spectrum, it is preferable to have the chosen beat frequency between the transmitted signals fall within this frequency range.

Finally, it is noted that the present invention may be used to detect faulty connections in any network that can propagate RF signals. For example, it can be used to test connections in local broadband computer networks. More generally, the present invention can be used whereever a fault in the system connections results in a non-linear characteristic with respect to signals transmitted through the system.

What is claimed is:

1. A method for detecting a faulty connection between the mating surfaces of a connector in a cable television communication system, said method comprising;

transmitting a signal having energy content at respective first and second frequencies through said communication system;

receiving a signal corresponding to a beat frequency between said first and second transmitted frequencies, said beat frequency signal being generated by heterodyning said first and second frequencies at said faulty connection; and measuring the time interval between the transmission of said signal and the reception of said beat frequency signal.

2. A method in accordance with claim 1 wherein said beat frequency signal corresponds to a signal having a frequency substantially equal to the frequency difference between said first and second frequencies.

3. A method in accordance with claim 1 further including:

converting said time interval measurement to a distance measurement corresponding to the location of said detected faulty connection.

4. A method in accordance with claim 1 wherein said signal at said first frequency is a continuous wave signal.

5. A method in accordance with claim 4 wherein said signal at said second frequency is a pulse modulated sine wave signal.

6. A method in accordance with claim 1 wherein said signal at said first frequency is a video signal.

7. A method in accordance with claim 6 wherein said signal at said second frequency is a pulse modulated sine wave signal.

* * * * *